(12) United States Patent
Wieting

(10) Patent No.: US 9,087,955 B1
(45) Date of Patent: *Jul. 21, 2015

(54) HUMIDITY CONTROL AND METHOD FOR THIN FILM PHOTOVOLTAIC MATERIALS

(71) Applicant: Stion Corporation, San Jose, CA (US)

(72) Inventor: Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/217,890

(22) Filed: Mar. 18, 2014

Related U.S. Application Data

(63) Continuation of application No. 13/106,257, filed on May 12, 2011, now Pat. No. 8,673,675, which is a continuation of application No. 12/569,356, filed on Sep. 29, 2009, now Pat. No. 7,947,524.

(60) Provisional application No. 61/101,640, filed on Sep. 30, 2008.

(51) Int. Cl.
*H01L 21/02* (2006.01)
*H01L 31/18* (2006.01)

(52) U.S. Cl.
CPC ..................... *H01L 31/18* (2013.01)

(58) Field of Classification Search
CPC ............. H01L 27/1423; H01L 21/02568; H01L 25/045; H01L 31/0745; H01L 31/0392; H01L 31/03928; H01L 31/1864
USPC ........ 438/64, 89, 91; 257/E29.255, E31.027, 257/117, 126
See application file for complete search history.

(56) References Cited

U.S. PATENT DOCUMENTS 8,673,675 B2 * 3/2014 Wieting .................... 438/64

* cited by examiner

*Primary Examiner* — Michael Lebentritt
(74) *Attorney, Agent, or Firm* — Kilpatrick Townsend & Stockton LLP

(57) ABSTRACT

A method for processing a thin film photovoltaic module. The method includes providing a plurality of substrates, each of the substrates having a first electrode layer and an overlying absorber layer composed of copper indium gallium selenide (CIGS) or copper indium selenide (CIS) material. The absorber material comprises a plurality of sodium bearing species. The method maintains the plurality of substrates in a controlled environment after formation of at least the absorber layer through one or more processes up to a lamination process. The controlled environment has a relative humidity of less than 10% and a temperature ranging from about 10 degrees Celsius to about 40 degrees Celsius. The method subjects the plurality of substrates to a liquid comprising water at a temperature from about 10 degrees Celsius to about 80 degrees Celsius to process the plurality of substrates after formation of the absorber layer. The plurality of substrates having the absorber layer is subjected to an environment having a relative humidity of greater than about 10% to a time period of less then four hours.

18 Claims, 4 Drawing Sheets

HUMIDITY CONTROL AND METHOD FOR THIN FILM PHOTOVOLTAIC MATERIALS

This application is a continuation of U.S. patent application Ser. No. 13/106,257, filed on May 12, 2011, which is a continuation of U.S. patent application Ser. No. 12/569,356, filed Sep. 29, 2009, which claims priority from U.S. Provisional Application No. 61/101,640, filed Sep. 30, 2008, all commonly assigned and incorporated by reference in their entirety herein for all purposes.

BACKGROUND OF THE INVENTION

The present invention relates generally to photovoltaic materials and manufacturing method. More particularly, the present invention provides a method and structure for fabricating a thin film solar cells. Merely by way of example, the present method and structure include a thin film window layer for manufacture of copper indium gallium diselenide based thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, thin films often degrade over time or have limitations in efficiency. These and other limitations of these conventional technologies can be found throughout the present specification and more particularly below.

BRIEF SUMMARY OF THE INVENTION

Embodiments according to the present invention relate to photovoltaic materials and manufacturing method. More particularly, the present invention provides a method and structure for fabricating a thin film solar cells. Merely by way of example, the present method and structure include a thin film window layer for manufacture of copper indium gallium diselenide based thin film photovoltaic devices, but it would be recognized that the invention may have other configurations.

In a specific embodiment, a method for processing a thin film photovoltaic module is provided. The method includes providing a plurality of substrates, each of the substrates has a first electrode layer and an overlying absorber layer composed of CIGS or CIS material. In a specific embodiment, the absorber material comprises a plurality of sodium bearing species having a concentration of $5\times10^{19}$ per $cm^3$ and greater in a specific embodiment. In a specific embodiment, the method maintains the plurality of substrates in a controlled environment through one or more processes up to a lamination process or other packaging process. The controlled environment has a relative humidity of less than 10% and a temperature ranging from about 10 Degree Celsius to about 40 Degree Celsius in a specific embodiment. The method includes subjecting the plurality of substrates to a liquid comprising water at a temperature ranging from about 10 Degree Celsius to about 80 Degree Celsius to process the substrate after formation of the absorber layer. The plurality of substrates having the absorber layer are subjected to an environment having a relative humidity greater than 10 percent for a time period of less than four hours, but can be others. Of course there can be other variations, modifications, and alternatives.

In an alternative embodiment, a method for processing a thin film photovoltaic module is provided. The method includes providing a substrate having a first electrode layer and an overlying absorber layer composed of copper indium gallium selenide (CIGS)or copper indium selenide (CIS) material. In a specific embodiment, the absorber material includes a plurality of sodium bearing species, the sodium bearing species has a concentration of about $5\times10^{18}$ atoms per $cm^3$ and greater. The method maintains the substrate in a controlled environment after formation of at least the absorber layer through one or more processes up to a lamination process. The controlled environment is characterized by a relative humidity of less than 10% and a temperature ranging from about 10 degrees Celsius to about 40 degrees Celsius in a specific embodiment. In a specific embodiment, the substrate is subjected to a liquid comprising water at a temperature from about 10 degrees Celsius to about 80 degrees Celsius to process the plurality of substrates after formation of the absorber layer. The method subjects the substrate having the absorber layer to an environment having a relative humidity of greater than about 10% to a time period of less then four hours. The method further performs a lamination process on at least the substrate to form a solar module. The solar module is characterized by an efficiency parameter at a first efficiency level before the lamination process and a second efficiency level after the lamination process. The first efficiency level is within a predetermined amount of the second efficiency level in a specific embodiment. Of course there can be other variations, modifications, and alternatives.

Many benefits can be achieved by ways of the present invention. For example, For example, embodiments according to the present provide an easy to implement method to improve an conversion efficiency or light extraction for a CIS or CIGS thin film photovoltaic cell. Additionally, the present method provides a cost effective way to fabricate photovoltaic cells. Depending on the embodiment, one or more of the benefits may be achieved. One skilled in the art would recognize other variations, modifications, and alternatives. These and other benefits are described throughout the present specification and more particularly below.

DETAILED DESCRIPTION OF THE INVENTION

Embodiments according to the present invention direct to fabrication of photovoltaic material. More particularly, embodiments according to the present invention provide a method and structure for fabricating a thin film photovoltaic cell. Merely by way of example, the present invention provides a method of treating a window layer to improve a light socking characteristic and conversion efficiency of the photovoltaic cell. But it would be recognize that embodiments according to the present invention would have a broader range of applicability.

Figure 1:
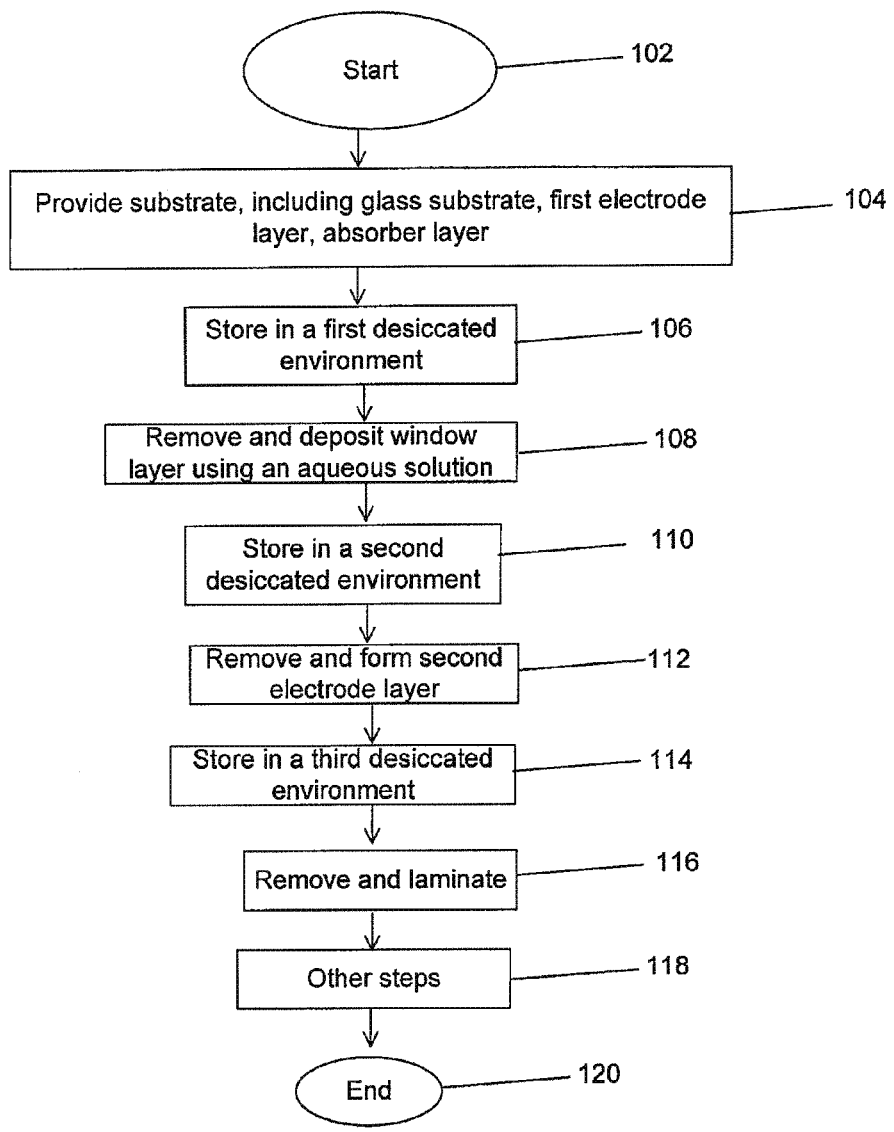
FIG. 1 is a simplified process flow diagram illustrating a method for fabricating a photovoltaic cell according to an embodiment of the present invention.

FIG. 1 is a simplified process flow diagram illustrating a method of fabricating a photovoltaic cell according to an embodiment of the present invention. The diagram is merely an example, which should not unduly limit the claims herein. One skilled in the art would recognize other variations, modifications, and alternatives. As shown, the method begins with a Start step (Step 102). The method includes providing a substrate (Step 104). The substrate includes a transparent substrate material having a film stack comprises at least a first electrode layer, and an absorber layer, layer deposited thereon. The absorber layer comprises a copper indium selenide (CIS) material or a copper indium gallium selenide (CIGS) material in a specific embodiment. In a specific embodiment, the substrate is maintained (Step 106) in a first controlled environment, which is desiccated, having a relative humidity of less than 10 percent and at a temperature ranging from about 10 Degree Celsius to about 50 Degree Celsius. The substrate including at least the absorber is removed form the controlled environment and subjected to an aqueous solution to deposit a window layer (Step 108). The aqueous solution contains a cadmium species, an ammonia species and a thiourea species to form as a cadmium sulfide material for the window layer in a specific embodiment. The substrate, now comprises the first electrode layer, the absorber layer, and the window layer is allowed to be stored (Step 110) in a second controlled environment. The controlled environment is a desiccated environment characterized by a relative humidity of less than 10 percent in a specific embodiment. The method removes the substrate and forming a second electrode layer (Step 110) overlying a surface region of the window layer. The second electrode layer can be a transparent conductive oxide material such as indium tin oxide, or other doped oxides, depending on the application. The substrate is stored in a third desiccated environment (Step 114). The method removes the substrate from the third desiccated environment and performs a lamination process to seal the photovoltaic cell a specific embodiment. The method performs other steps (Step 118), including light soaking, testing, framing and others to form a solar module. The method ends with an end step (Step 120). Of course there can be other variations, modifications, and alternatives.

The above sequence of steps provides a method of fabricating a photovoltaic cell according to an embodiment of the present invention. More particularly, the present method provides a technique for improving efficiency of the solar cell by environmental controlling the manufacturing and related methods. Depending on the embodiment, one or more steps may be added, one or more steps may be eliminated, one or more steps may be provided in a difference sequence without departing from the scope of the present invention. One skilled in the art would recognize other variations, modifications, and alternatives.

Figure 2:
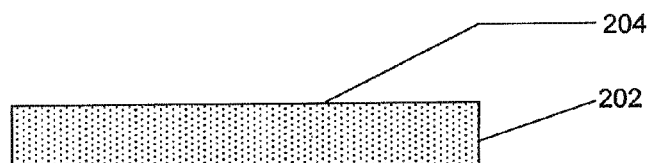
FIG. 2-10 are simplified diagrams illustrating a method for fabricating a photovoltaic cell according to an embodiment of the present invention.

FIGS. 2-11 are simplified diagrams illustrating a method of fabricating a photovoltaic cell according to an embodiment of the present invention. These diagrams are merely examples and should not unduly limit the claims herein. One skilled in the art would recognize other variations, modifications, and alternatives. As shown in FIG. 2, a transparent substrate member 202 including a surface region 204 is provided. The substrate member can be a glass material in certain embodiment. In a specific embodiment, soda lime glass is a cost effective option for the transparent substrate member. Other suitable transparent substrates such as quartz, fused silica, or solar glass can also be used. Each of the transparent substrate can include a barrier layer deposited on a surface region. The barrier layer prevents sodium ions from the glass material to diffuse into photovoltaic material area in a specific embodiment. The barrier layer can be a dielectric material such as silicon oxide deposited using technique such as a sputtering process, a chemical vapor deposition process, including plasma enhanced processes, and others. Other barrier materials may also be used. These barrier materials include aluminum oxide, titanium nitride, silicon nitride, tantalum oxide, zirconium oxide depending on the embodiment.

Figure 3:
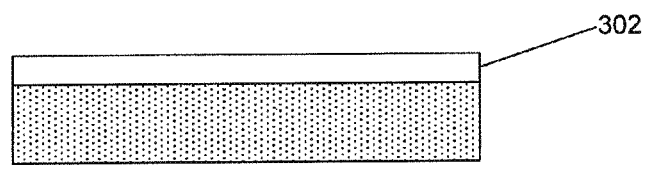

Referring to FIG. 3, the method includes forming a first electrode layer 302 overlying the surface region of the transparent substrate member which can have a barrier layer formed thereon. The first electrode layer may be provided using a transparent conductor oxide (TCO) such as indium tin oxide (commonly called ITO), fluorine doped tin oxide, and the like. In certain embodiments, the first electrode layer may be provided using a metal material. The metal material may be molybdenum in a specific embodiment. Other suitable metal materials such as gold, silver, tungsten, nickel or an alloy may also be used. The first electrode layer can be formed using deposition techniques such as sputtering, plating, physical vapor deposition (including evaporation, sublimation), chemical vapor deposition (including plasma enhanced processes) following by a patterning process in a specific embodiment. Of course there can be other variations, modifications, and alternatives.

Figure 4:
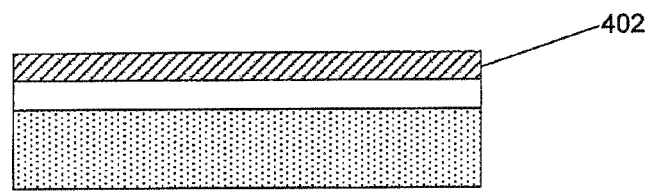

As shown in FIG. 4, the method includes forming an absorber layer 402 overlying a surface region of the first electrode layer. The absorber layer can be a thin film semiconductor material in a specific embodiment. In a specific embodiment, the thin film semiconductor material is a p-type semiconductor material provided by a copper indium diselenide (CIS) material, or a copper indium gallium diselenide (CIGS) material, any combination of these, or others, depending on the application. Other materials such as copper indium disulfide, copper indium aluminum disulfide, copper indium gallium disulfide, and others, including any combinations. The absorber layer may be deposited by techniques such as sputtering, plating, evaporation including a selenization step. Further details of the formation of the absorber material made of copper indium disulfide may be found in U.S. Patent Application No. 61/059,253, titled "High Efficiency Photovoltaic Cell and Manufacturing Method," commonly assigned, and hereby incorporated by reference. Of course, there can be other variations, modifications, and alternatives.

Figure 5:
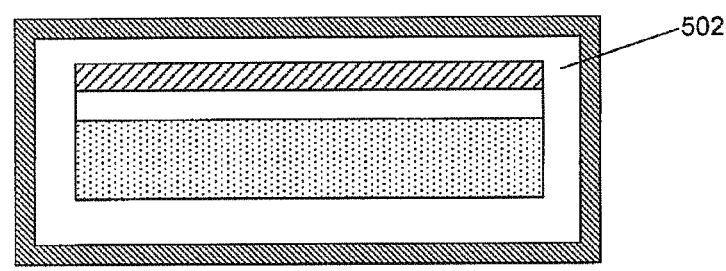
Figure 6:
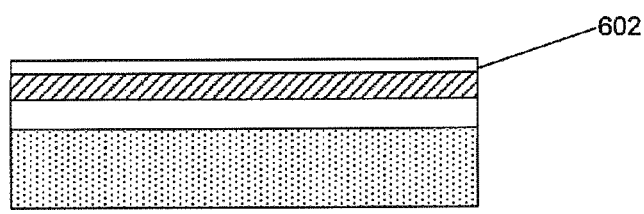

As shown in FIG. 5, the method includes maintaining the substrate member comprising the absorber layer in a first controlled environment 502 to preserve a conversion efficiency of the thin film photovoltaic. The controlled environment is characterized by a relative humidity less than 50 percent and preferably less than 10 percent in a specific embodiment. In a specific embodiment, the substrate member is exposed to a condition having a relative humidity greater than about 10 percent for less than about four hours and preferably less than two hours. The condition having a humidity greater than 10 percent is characterized by a water vapor species that has a high chemical activity. The controlled environment is further characterized by a temperature ranging from about 10 Degree Celsius to about 40 Degree Celsius in a specific embodiment. In a specific embodiment, the copper indium diselenide or the copper indium gallium diselenide material can include a plurality of sodium species having a concentration of about $5 \times 10^{19}$ per $cm^3$ or greater within a thickness of the copper indium diselenide or copper indium gallium diselenide material and/or in a surface region of the copper indium diselenide or copper indium gallium diselenide material. For a yet unknown reason, the plurality of sodium species affect the performance, for example, conversion efficiency of the photovoltaic cell, upon exposure to a water vapor species, which can have a high chemical activity in a specific embodiment. The plurality of sodium species may be a diffusion species from the first electrode layer or a compensating species depending on the embodiment. The plurality of sodium species may also be added from an external source to improve the performance of the photovoltaic cell in a specific embodiment. Of course there can be other variations, modifications, and alternatives.

In a specific embodiment, the method forms a window layer 602 overlying a surface region of the absorber layer. The window layer is often provided using a wide bandgap n-type semiconductor material for a p-type absorber layer. For a copper indium diselenide or copper indium gallium diselenide absorber material, the window layer can use a cadmium sulfide material in a specific embodiment. The cadmium sulfide material may be deposited using techniques such as sputtering, vacuum evaporation, chemical bath deposition, among others. Of course there can be other variations, modifications, and alternatives.

In a specific embodiment, the cadmium sulfide window material is deposited using a chemical bath deposition method, which provides a cost effective way for a large area deposition and can be easily adapted for a batch process. The chemical bath deposition method uses an aqueous solution comprising a cadmium species, a sulfur bearing species, and an ammonia species in a specific embodiment. The sulfur bearing species can be provided by a organosulfur such thiourea in a specific embodiment. The chemical bath deposition method can be provide at a temperature ranging from about 10 Degree Celsius to about 80 Degree Celsius in a specific embodiment. The substrate including the window layer is subjected to a cleaning process, including one or more rinse and dry steps after deposition in a specific embodiment. The cleaning process can use deionized water in a specific embodiment. In certain embodiments, other window materials may also be used. These other window materials may include zinc sulfide (ZnS), zinc selenide (ZnSe), zinc oxide (ZnO), zinc magnesium oxide (ZnMgO), and the like. Of course there can be other variations, modifications, and alternatives.

Figure 7:
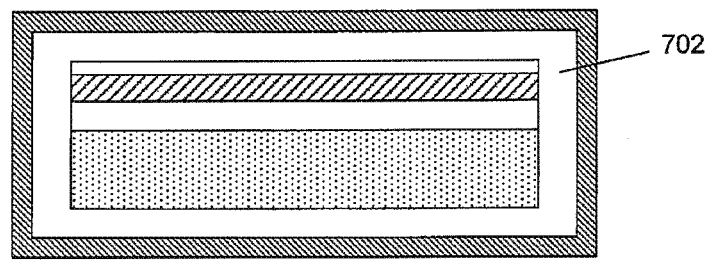

In a specific embodiment, the method includes maintaining the substrate member including the window layer in a second controlled environment 702 as shown in FIG. 7. The second controlled environment is characterized by a relative humidity of less than 50 percent and preferably less than 10 percent in a specific embodiment. In a specific embodiment, a relative humidity greater than about 10 percent is characterized by a water vapor species that has a high chemical activity. The second controlled environment is further characterize by a temperature ranging from about 10 Degree Celsius to about 40 Degree Celsius in a specific embodiment.

Figure 8:
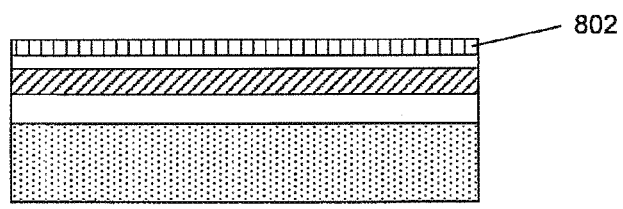

Referring to FIG. 7, the method includes maintaining the substrate in a second controlled environment 702 after forming the window layer. The second controlled environment can be a desiccated environment characterized by a relative humidity of less than 50 percent and preferably less than 10 percent in a specific embodiment. In a specific embodiment, a relative humidity greater than about 10 percent is characterized by a water vapor species that has a high chemical activity. The second controlled environment is further characterized by a temperature ranging from about 10 Degree Celsius to about 40 Degree Celsius in a specific embodiment. The second controlled environment may be provided by a dry box using a purging gas such as dried nitrogen or other inert gases, but can be others. Depending on the embodiment, the substrate may be stored in a vacuum environment. Keeping the substrate in the desiccated environment between processes, for example, after absorber layer deposition and window layer deposition, allows an improved performance including higher conversion efficiency of the photovoltaic cell, which will be further described in more detailed. Of course there can be other variations, modifications, and alternatives As shown in FIG. 8, the substrate is removed from the second controlled environment and a second controlled environment and a second electrode layer 802 is formed overlying the window layer, forming a photovoltaic cell. The second electrode layer is preferably a transparent conductive oxide (TCO) to allow a higher fill factor for the photovoltaic cell in a specific embodiment. The second electrode layer can be a single layer electrode structure or a multilayer electrode structure. For example, the second electrode layer may use a zinc oxide material having an n-type impurity characteristic. In a specific embodiment, the n-type impurity characteristic can be provided using impurity species such as boron, aluminum, indium, and other electron deficient elements. In other embodiments, the n type impurity characteristic for zinc oxide material may be provided using a non-stochiometric zinc oxide such as a zinc rich zinc oxide material. The zinc oxide material may be deposited using a metalorganic chemical vapor deposition process in a specific embodiment. Of course there can be other variations, modifications, and alternatives.

The second electrode layer may use other transparent conducting material such as indium tin oxide (ITO), fluorine doped tin oxide, and others.

Figure 9:
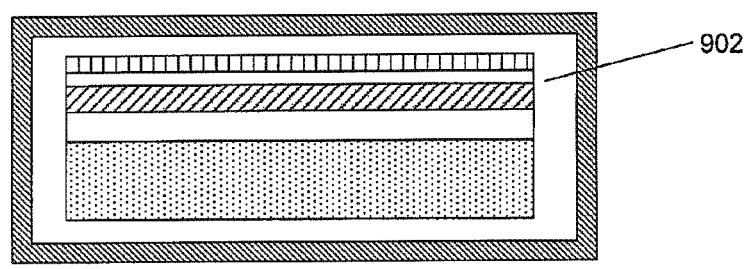

The method includes storing the substrate in a third controlled environment t 902 as shown in FIG. 9. The third controlled environment may be provided using a dry box using a purging gas such as dried nitrogen or other inert gases. Depending on the embodiment, the substrate may be stored in a vacuum environment. In a specific embodiment, the third controlled environment is maintained at a relative humidity of less than 50 percent and preferably less than 10 percent. By maintaining the substrate in a controlled or a desiccated environment between processes prior to lamination, the photovoltaic cell can have an improved overall performance such as higher conversion efficiency in a specific embodiment.

Figure 10:
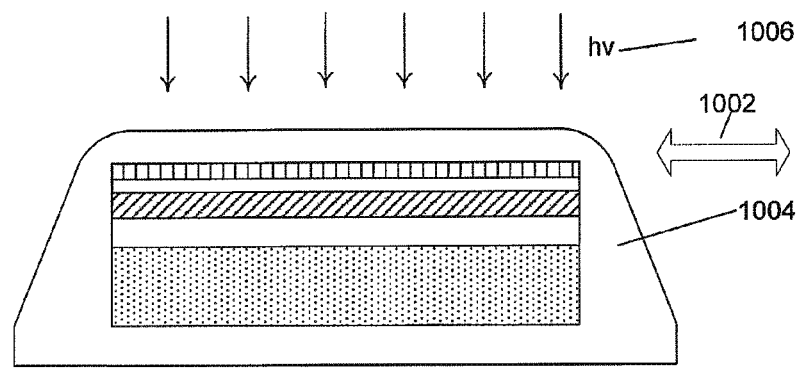

Referring to FIG. 10, the photovoltaic call is sealed using a lamination process 1002 to form a solar cell module. The lamination process uses a co-polymer laminating material 1004 such as ethyl vinyl acetate, commonly known as EVA to protect the photovoltaic cell from environmental elements in a specific embodiment. In a specific embodiment, the solar cell module is subjected to a light soaking process 1006 to change a conversion efficiency characteristic of the photovoltaic cell. The light soaking process includes exposing the solar cell module to sunlight or sunlight equivalent for a period of time. The period of time can be less than about 24 hours and may be less than 10 hours in a specific embodiment. The light soaking process causes the photovoltaic cell to change from a first conversion efficiency level to a second conversion efficiency level. In the case of the CIS or the CIGS based thin film photovoltaic cell, the second conversion level is greater than the first conversion efficiency level. Depending on the embodiment, the second conversion efficiency level may be one percentage point or more greater than the first conversion efficiency level. This is in contrast to a silicon based photovoltaic cell where the conversion efficiency tends to decrease with the light soaking process. Additionally, the period of time for a CIGS or CIS based thin film photovoltaic cell that is not desiccated after forming the window layer requires a longer period of light soaking, typically longer than 30 hours, to achieve a similar increase in conversion efficiency. Of course there can be other variations, modifications, and alternatives.

Depending on the embodiment, there can be variations. For example, the method can perform other steps such as isolation of the second electrode layer, electrode bus preparation, perimeter film deletion, ribbon attachment, circuit testing, and others before performing the lamination process. Depending upon the embodiment, one or more of these steps can be added, removed, or others can be added or removed. Of course there can be other variations, modifications, and alternatives.

Although the present invention has been described using specific embodiments, it should be understood that various changes, modifications, and variations to the method utilized in the present invention may be effected without departing from the spirit and scope of the present invention as defined in the appended claims. Additionally, although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein.

What is claimed is:

1. A method for processing a thin film photovoltaic module, the method comprising:
    subjecting a plurality of substrates to a desiccated environment having a relative humidity of less than about 10%, wherein the substrates comprise an absorber layer overlying an electrode layer;
    subjecting the plurality of substrates to a liquid comprising water to process the plurality of substrates; and
    subjecting the plurality of substrates to an environment having a relative humidity of greater than about 10% to a time period of less then four hours.

2. The method of claim 1 further comprising performing a lamination process on least one of the plurality of substrates in a modular form as a solar module, the solar module being characterized by an efficiency parameter at a first efficiency level before the lamination process and a second efficiency level after the lamination process, the first efficiency level being within a predetermined amount of the second efficiency level.

3. The method of claim 1 wherein the relative humidity of greater than 10% is characterized by a water vapor species having a high chemical activity.

4. The method of claim 2 further performing a light soaking process on the solar module to increase an efficiency level from a third efficiency to a fourth efficiency.

5. The method of claim 4 wherein the light soaking process comprises subjecting the solar module to electromagnetic radiation derived from a solar or a solar equivalent light source.

6. The method of claim 4 wherein the light soaking process is maintained for about thirty hours or less.

7. The method of claim 2 wherein the second efficiency level is greater than the first efficiency level by at least 1 percent point.

8. The method of claim 2 wherein the second efficiency level is greater than the first efficiency level by at least 2 percent.

9. The method of claim 1 wherein subjecting the plurality of substrates to a liquid includes forming a window layer overlying the absorber layer.

10. The method of claim 9 wherein the window layer comprises a cadmium sulfide material.

11. The method of claim 1 wherein the liquid comprises a cadmium species, an organosulfur species, and an ammonium species provided in a bath maintained at a bath temperature ranging from about 50 degree Celsius to about 60 degree Celsius.

12. The method of claim 1 further comprises a patterning process after forming the window layer.

13. The method of claim 12 wherein the patterning process is a mechanical patterning process removing selected portions of the absorber layer material and the window layer material.

14. The method of claim 1 further comprising forming a second electrode layer overlying the window layer, the second electrode layer comprises a transparent conductive oxide selected from: ITO, SnO:F or ZnO:Al.

15. The method of claim 14 further comprises patterning the transparent conductive oxide layer.

16. A method for processing a thin film photovoltaic module, the method comprising:
    subjecting a substrate to a desiccated environment having a relative humidity of less than about 10%, wherein the substrate comprises an absorber layer overlying an electrode layer;
    subjecting the substrate to a liquid comprising water;
    subjecting the substrate to an environment having a relative humidity of greater than about 10% for a first time period; and performing a lamination process on at least the substrate to form a solar module, the solar module being characterized by an efficiency parameter at a first efficiency level before the lamination process and a second efficiency level after the lamination process.

17. The method of claim 16 further performing a light soaking process on the solar module to increase its efficiency level.

18. The method of claim 17 wherein the light soaking process comprises subjecting the solar module to electromagnetic radiation derived from a solar or a solar equivalent light source.

\* \* \* \* \*